United States Patent [19]

Kao

[11] Patent Number: 6,017,222

[45] Date of Patent: Jan. 25, 2000

[54] ELECTRICAL CONNECTOR ASSEMBLY FOR CONNECTING FLEXIBLE CONNECTING STRIPS OF A FILM CIRCUITRY AND A MAIN CIRCUIT BOARD

[75] Inventor: George Kao, Taipei, Taiwan

[73] Assignee: Peripheral Technology Inc., Taipei, Taiwan

[21] Appl. No.: 09/191,229

[22] Filed: Nov. 13, 1998

[51] Int. Cl.[7] .................................................. H01R 9/09
[52] U.S. Cl. ............................ 439/67; 439/493; 439/496
[58] Field of Search ............................... 439/67, 77, 493, 439/496

[56] References Cited

U.S. PATENT DOCUMENTS

| | | | |
|---|---|---|---|
| 4,913,656 | 4/1990 | Gordon et al. | 439/67 |
| 4,917,613 | 4/1990 | Kabadi | 439/67 |
| 5,071,357 | 12/1991 | Van Brunt, Jr. et al. | 439/67 |
| 5,482,473 | 1/1996 | Lord et al. | 439/67 |

Primary Examiner—Renee S. Luebke
Assistant Examiner—Hae Moon Hyeon
Attorney, Agent, or Firm—Harness, Dickey & Pierce, P.L.C.

[57] ABSTRACT

An electrical connector assembly is used to connect first and second flexible connecting strips of a film circuitry and a main circuit board. Each of the first and second flexible connecting strips has a flat end portion and a plurality of electrical terminals formed on one of the opposite side faces of the flat end portion. The electrical connector assembly includes an inverted U-shaped clip member and a connector board. The inverted U-shaped clip member has first and second leg portions. The first leg portion is integrally formed with the flat end portion of the first flexible connecting strip. The second leg portion is connected adhesively to the flat end portion of the second flexible connecting strip. The connector board has a plurality of conductive members formed on two opposed side faces of the connector board, and a mating portion for connecting electrically the conductive members to the main circuit board. The connector board is sandwiched bet ween the flat end portions of the first and second flexible connecting strips. The conductive members on the connector board are connected electrically and respectively to the electrical terminals on the flat end portions.

4 Claims, 7 Drawing Sheets

ELECTRICAL CONNECTOR ASSEMBLY
FOR CONNECTING FLEXIBLE
CONNECTING STRIPS OF A FILM
CIRCUITRY AND A MAIN CIRCUIT BOARD

BACKGROUND OF THE INVENTION

1. Field of the Invention

This invention relates to an electrical connector assembly, more particularly to an electrical connector for connecting flexible connecting strips of a film circuitry and a main circuit board.

2. Description of the Related Art

Referring to FIG. 1, it is known that a pair of connecting strips 1 of a film circuitry (not shown) can be connected to a main circuit board 3 by inserting two flat end portions 11 of the connecting strips 1 into sockets 2 on the main circuit board 3. Each of the flat end portions 11 has rows of electrical terminals 111 formed on one of the opposite side faces thereof in order to connect electrically with corresponding contacts that are provided in the sockets 2. Since the connecting strips 11 are made of a flexible material, insertion of the flat end portions 11 into the sockets 2 is sometimes difficult to conduct.

FIG. 2 illustrates a conventional electrical connector assembly 5 for connecting a pair of flexible connecting strips of a film circuitry (not shown) and a main board 6. The electrical connector assembly 5 comprises a flexible connector 4 having a first end (not shown) connected to the connecting strips of the film circuitry and a second end 41 with a plurality of contacts 411, a flexible circuit board 51, and a clamping unit 53 for clamping the flexible circuit board 51 to the second end 41 of the flexible connector 4. The flexible circuit board 51 has a receptacle connector 52 welded thereto for electrical connection with a plug connector 61 on the main circuit board 6. Since the flexible circuit board 51 cannot be manufactured by means of an automatic process, the high manufacturing cost of the electrical connector assembly 5 is relatively high. In addition, because the clamping unit 53 exerts simply a force perpendicular to the flexible circuit board 51 onto the flexible circuit board 51 and the flexible connector 4, the flexible circuit board 51 is liable to separate from the flexible connector 4 when the flexible circuit board 51 is drawn by a downward force generally parallel to the flexible circuit board 51. Still further, one of the flexible connecting strips of the film circuitry is twisted in order to turn the terminals form(d on a side face thereof so as to connect the first end of the flexible connector 4 together with the terminals formed on the other one of the flexible strips in the same orientation. Twisting of the flexible connecting strip sometimes damages the circuit traces that are embedded in the flexible connecting strip.

SUMMARY OF THE INVENTION

The object of the present invention is to provide an electrical connector assembly which can overcomes the aforementioned disadvantages that are commonly associated with the conventional electrical connector assembly.

According to the present invention, the electrical connector assembly is adapted for connecting first and second flexible connecting strips of a film circuitry and a main circuit board. Each of the first and second flexible connecting strips has a flat end portion and a plurality of electrical terminals formed on one of the opposite side faces of the flat end portion. The electrical connector assembly comprises an inverted U-shaped clip member and a connector board. The inverted U-shaped clip member has first and second leg portions. The first leg portion is adapted to be integrally formed with the flat end portion of the first flexible connecting strip. The second leg portion is adapted to be connected adhesively to the flat end portion of the second flexible connecting strip. The connector board has two opposed side faces, a plurality of conductive members formed on the opposed side faces of the connector board, and a mating portion adapted for connecting electrically the conductive members to the main circuit board. The connector board is sandwiched between the flat end portions of the first and second flexible connecting strips. The conductive members on the opposed side faces of the connector board are connected electrically and respectively to the electrical terminals on the flat end portions.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
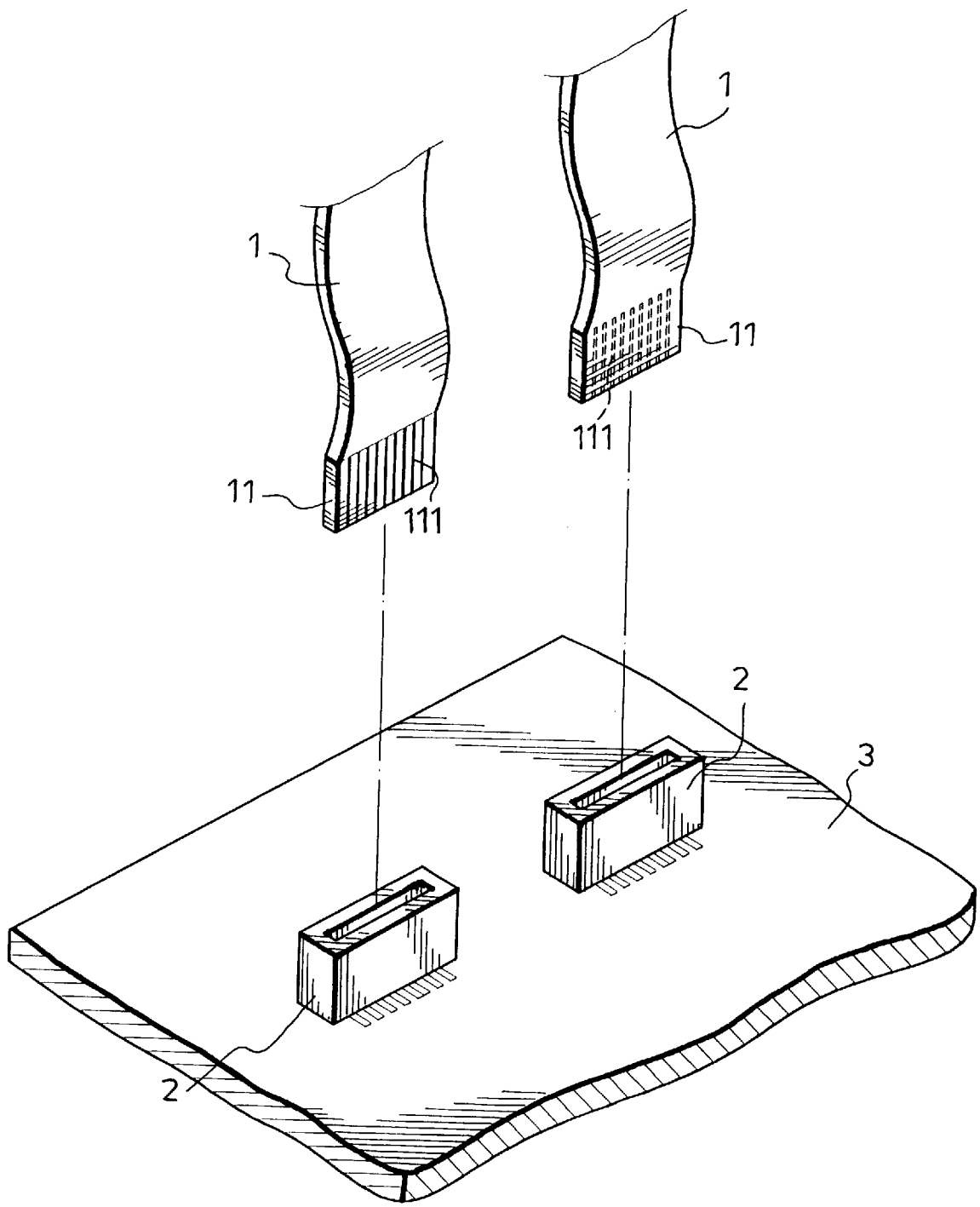
FIG. 1 is a schematic view illustrating how a pair of connecting strips of a film circuitry are connected to a main circuit board in a conventional manner.
Figure 2:
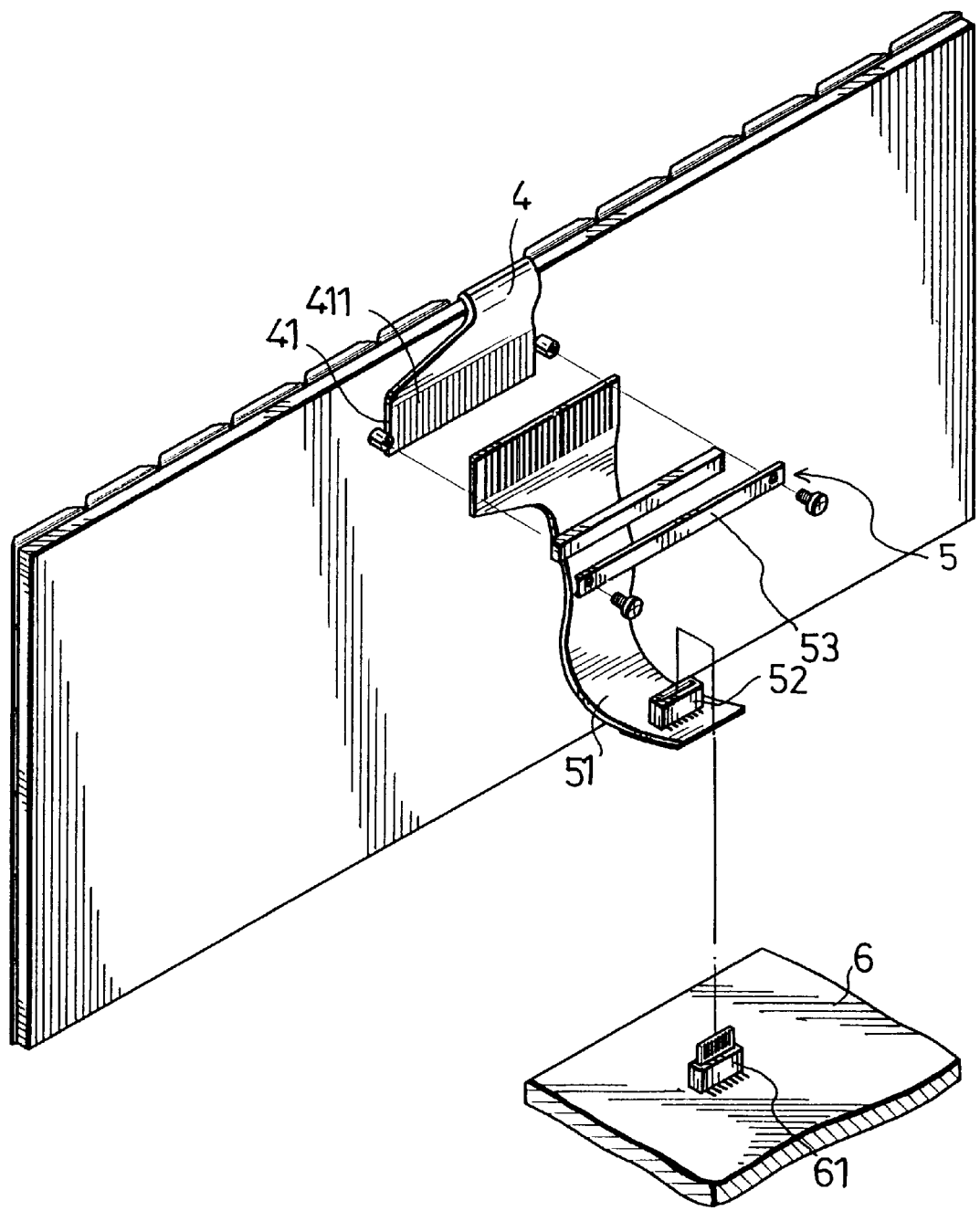
FIG. 2 is an exploded schematic view illustrating how a conventional electrical connector assembly connects a film circuitry and a main circuit board.
Figure 3:
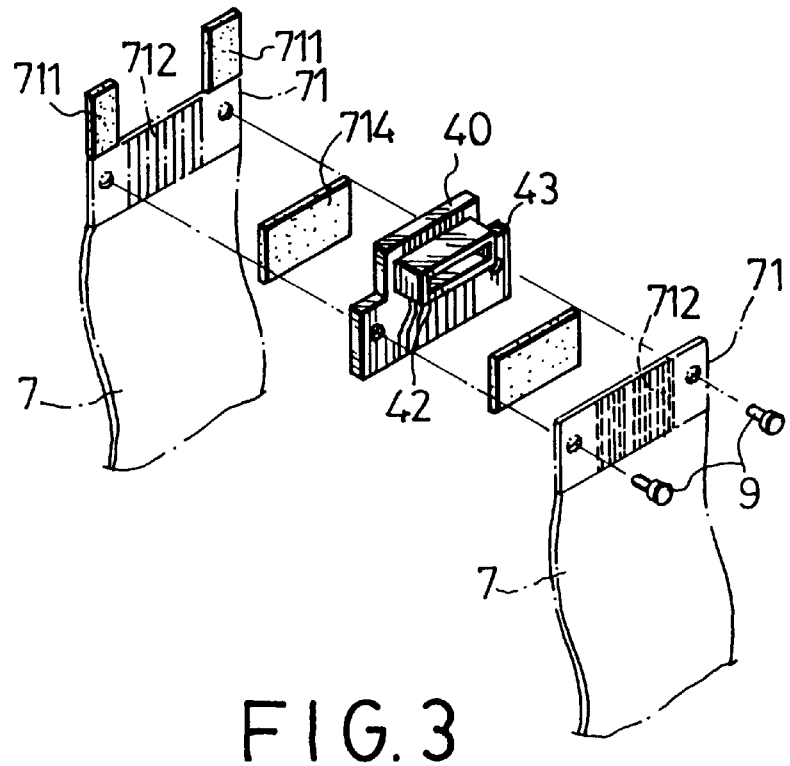
FIG. 3 is an exploded view of a first preferred embodiment of an electrical connector assembly according to the present invention.

Referring to FIG. 3, the first preferred embodiment of an electrical connector assembly according to the present invention is shown to comprise a clip member, which includes two clips 711, and a connector board 40. The electrical connector assembly is adapted for connecting first and second flexible connecting strips 7 of a film circuitry (not shown) and a main circuit board 30 (see FIG. 7). Each of the first and second flexible connecting strips 7 has a flat end portion 71 and a plurality of electrical terminals 712 formed on one of the opposite side faces of the flat end portion 71.

Figure 4:
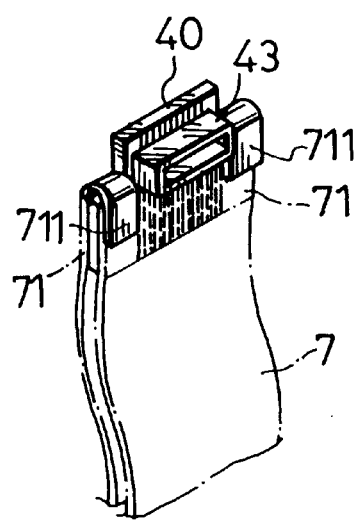
FIG. 4 is a perspective view of the first preferred embodiment.
Figure 5:
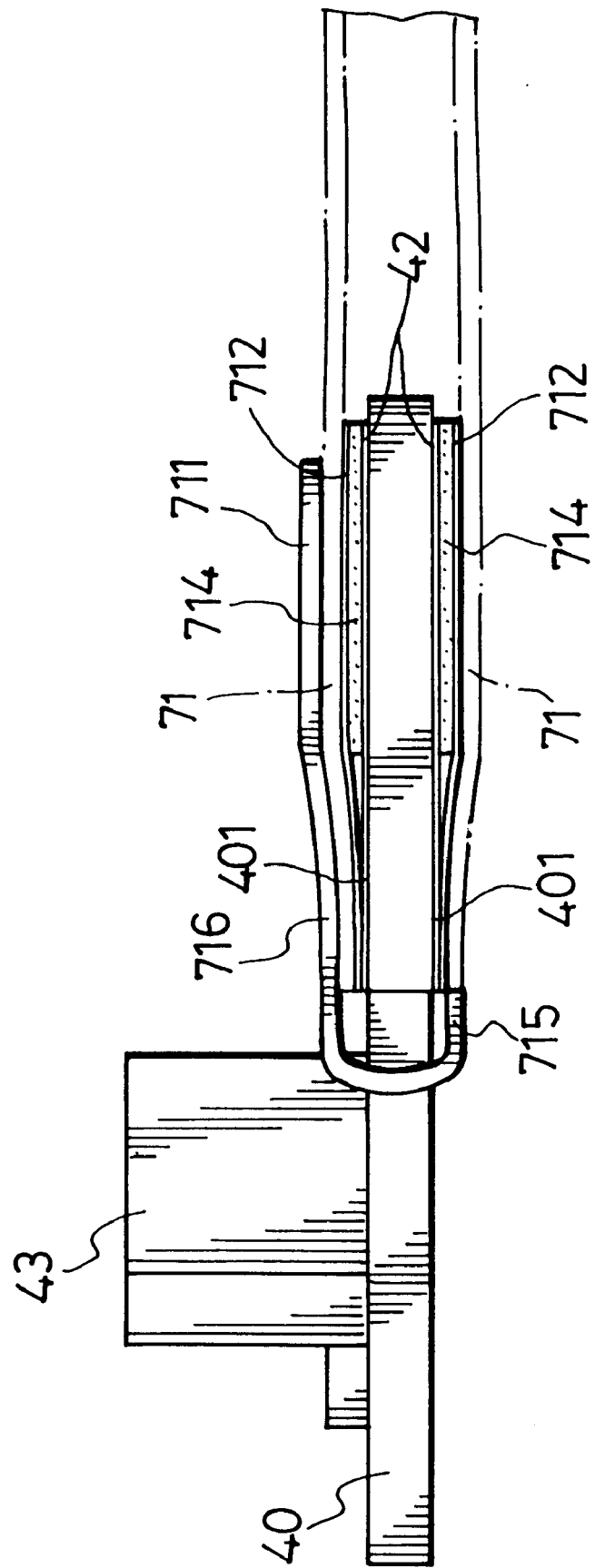
FIG. 5 is a side view of the first preferred embodiment.
Figure 7:
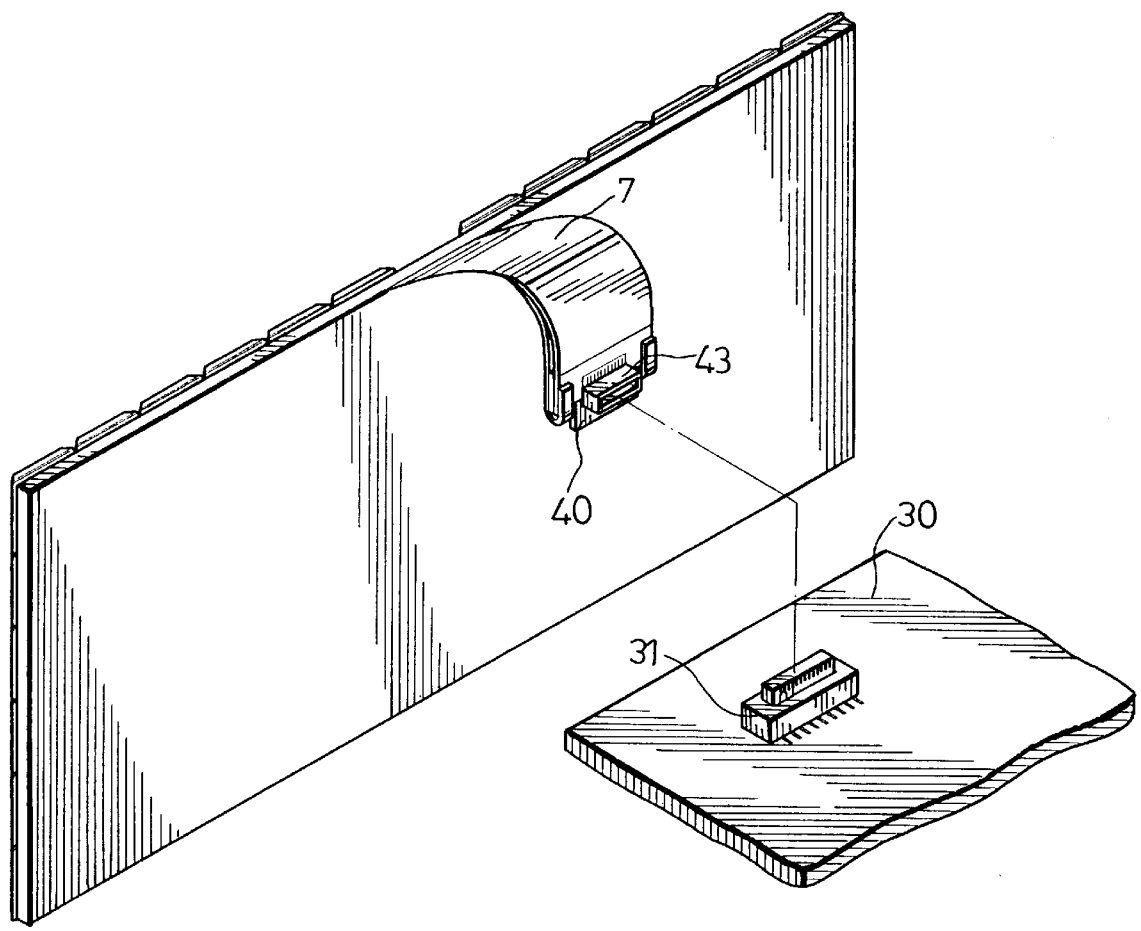
FIG. 7 is a schematic view illustrating how the first preferred embodiment of the electrical connector assembly is connected to a plug connector on a main circuit board.

Referring to FIGS. 4 and 5, in assembly, each of the clips 711 is bent to form an inverted U-shaped configuration that has first and second leg portions 715, 716. The first leg portion 715 is integrally formed with the flat end portion 71 of the first flexible connecting strip 7. The second leg portion 716 is connected adhesively to the flat end portion 71 of the second flexible connecting strip 7. The connector board 40 has a plurality of conductive members 42 formed on two opposed side faces 401 of the connector board 40, and a mating portion 43 adapted for connecting electrically the conductive members 42 to the main circuit board 7 (see FIG. 7). The connector board 40 is sandwiched and clamped between the flat end portions 71 of the first and second flexible connecting strips 7. The conductive members 42 on the upper portions of the opposed side faces 401 of the connector board 40 are connected electrically and respectively to the electrical terminals 712 on the flat end portions 71. The mating portion 43 is a receptacle connector that is connected electrically to the conductive members 42 of the connector board 40 and to a complementary mating portion 31, e.g. a plug connector, formed on the main circuit board 30, as best illustrated in FIG. 7. The flat end portions 71 of the connecting strips 7 and the lower portions of the opposed side faces 401 of the connector board 40 have a heat-conduction adhesive 714 provided therebetween in order to enhance the engaging force therebetween. In addition, the flat end portions 71 of the connecting strips 7 and the connector board 40 are fastened to one another by rivets 9 to ensure firm connection between the connecting strips 7 and the connector board 40.

It is noted that the connector board 40 can be positioned firmly between the flat end portions 71 of the connecting strips 7 even if a force is exerted on the connecting strips 7 in a direction either perpendicular or parallel to the connecting strips 7. In addition, one of the connecting strips 7 need not to be twisted when the flat end portions 71 of the connecting strips 7 are connected to the connector board 40.

Figure 6:
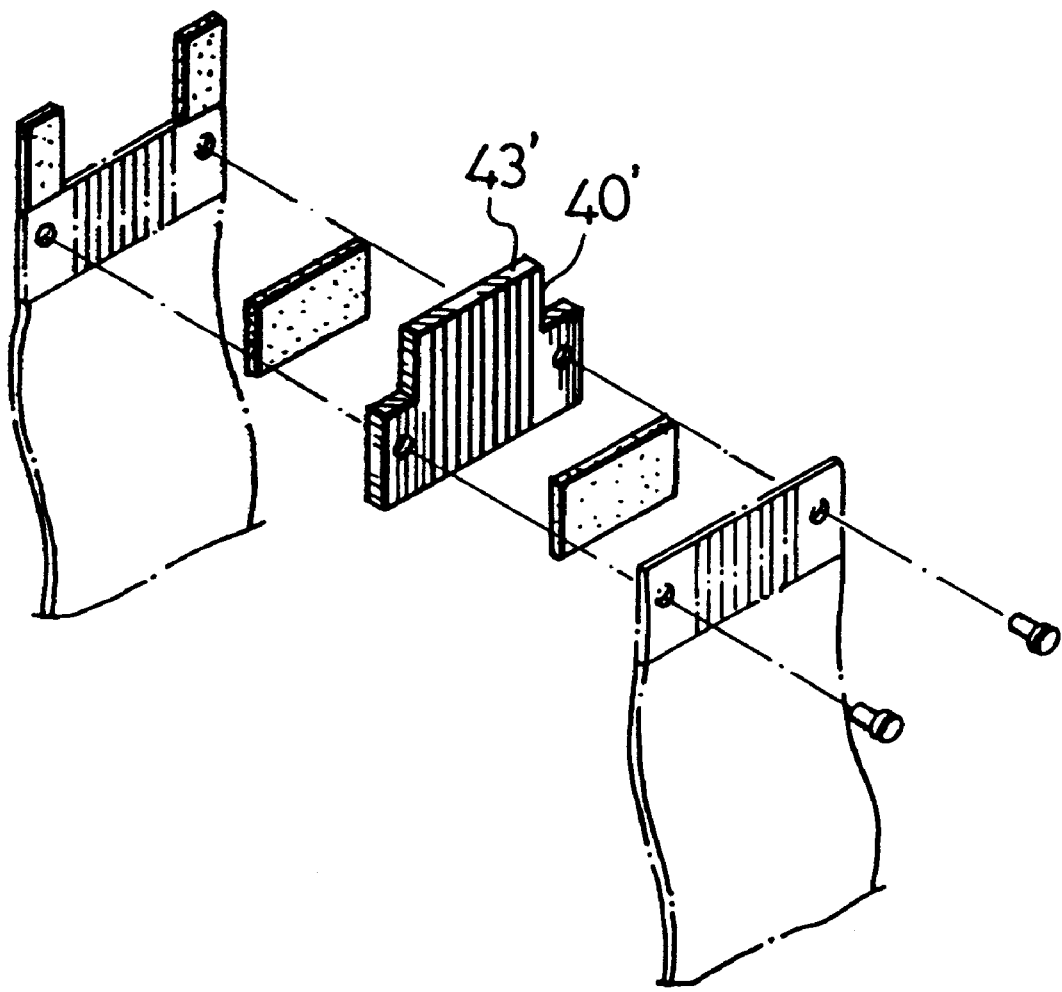
FIG. 6 is an exploded view of a second preferred embodiment of an electrical connector assembly according to the present invention.
Figure 8:
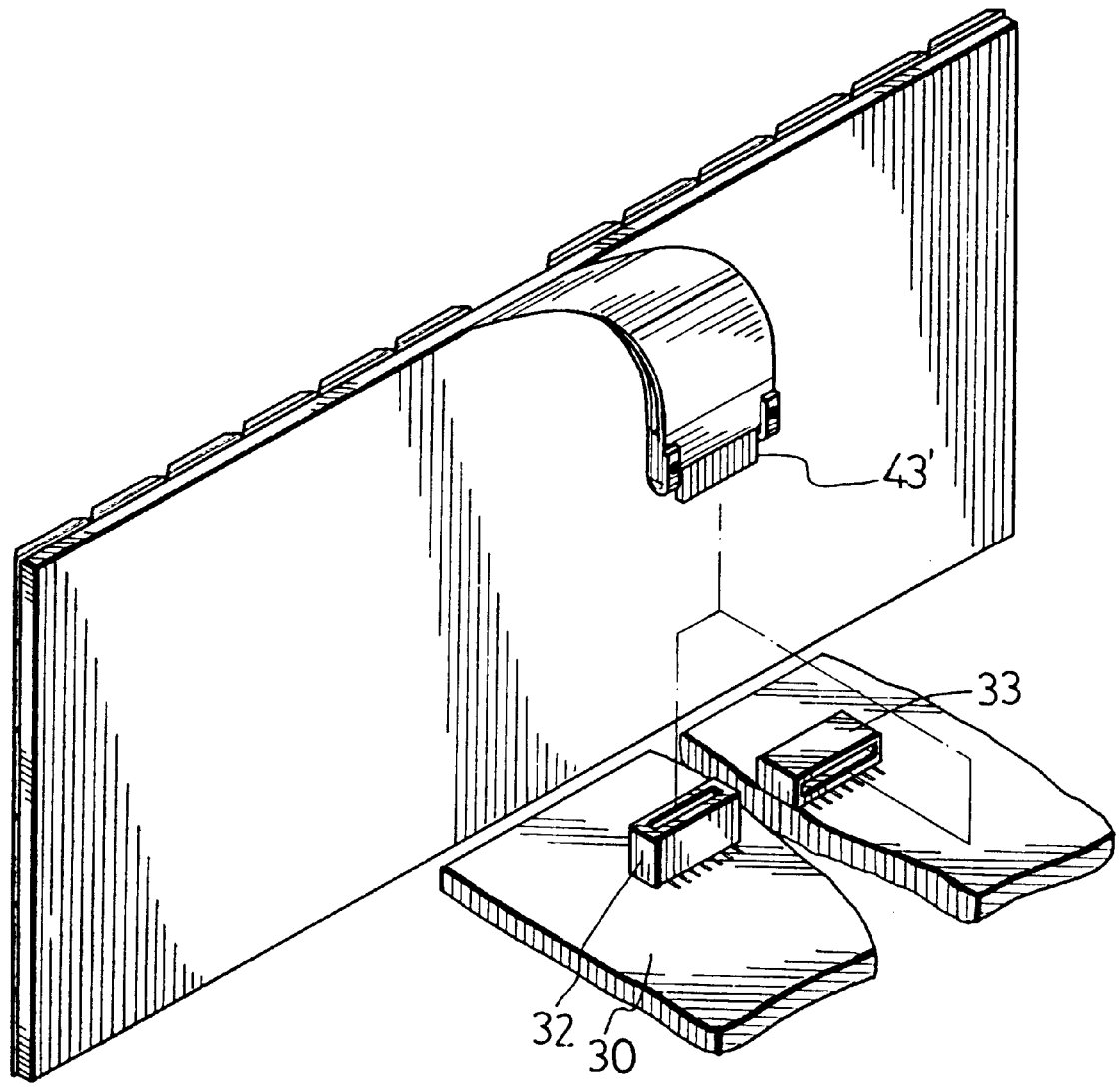
FIG. 8 is a schematic view illustrating how the second preferred embodiment of the electrical connector assembly is connected to receptacle connectors on the main circuit board.

Referring to FIG. 6, the second preferred embodiment of the electrical connector assembly of the present invention is shown to comprise a connector board 40'. The structure of the electrical connector assembly of this embodiment is generally similar to that of the electrical connector assembly of the first preferred embodiment, except that the mating portion 43' of the connector board 40' is a plug connector that is formed as part of the upper portion of the connector board 40'. The mating portion 43' can engage a complementary mating portion on the main circuit board 30, for example, either one of two receptacle connectors 32, 33 from a direction either perpendicular or parallel to the main circuit board 30, as best illustrated in FIG. 8.

While the present invention has been described in connection with what is considered the most practical and preferred embodiments, it is understood that this invention is not limited to the disclosed embodiments but is intended to cover various arrangements included within the spirit and scope of the broadest interpretations and equivalent arrangements.

I claim:

1. An electrical connector assembly for connecting first and second flexible connecting strips of a film circuitry and a main circuit board, each of the first and second flexible connecting strips having a flat end portion with two opposite side faces and a plurality of electrical terminals formed on one of the opposite side faces of the flat end portion, comprising:

an inverted U-shaped clip member having first and second leg portions, said first leg portion being adapted to be integrally formed with the flat end portion of the first flexible connecting strip, said second leg portion being adapted to be connected adhesively to the flat end portion of the second flexible connecting strip; and a connector board having two opposed side faces, a plurality of conductive members formed on said opposed side faces of said connector board, and a mating portion adapted for connecting electrically said conductive members to the main circuit board, said connector board being adapted to be sandwiched between the flat end portions of the first and second flexible connecting strips, said conductive members on said opposed side faces of said connector board being adapted to be connected electrically and respectively to the electrical terminals on the flat end portions.

2. The electrical connector assembly as defined in claim 1, wherein said inverted U-shaped clip member includes two inverted U-shaped clips.

3. The electrical connector assembly as defined in claim 1, wherein said mating portion of said connector board has a receptacle connector connected electrically to said conductive members of said connector board.

4. The electrical connector assembly as defined in claim 1, wherein said mating portion of said connector board is formed as a plug connector which is connected electrically to said conductive members of said connector board.

* * * * *